United States Patent [19]
Losee et al.

[11] Patent Number: 5,726,080
[45] Date of Patent: Mar. 10, 1998

[54] METHOD OF PERFORMING EDGE-ALIGNED IMPLANTS

[75] Inventors: David L. Losee, Fairport; James P. Lavine, Rochester; Gilbert A. Hawkins, Mendon; Mary R. Suchanski, Rochester, all of N.Y.

[73] Assignee: Eastman Kodak Company, Rochester, N.Y.

[21] Appl. No.: 757,715

[22] Filed: Nov. 26, 1996

[51] Int. Cl.$^6$ ............... H01L 21/265; H01L 21/70; H01L 27/00
[52] U.S. Cl. ............................................. 438/144
[58] Field of Search ........................... 437/3, 50, 53

[56] References Cited

U.S. PATENT DOCUMENTS

| | | | |
|---|---|---|---|
| 4,035,906 | 7/1977 | Tasch et al. | 29/578 |
| 4,613,402 | 9/1986 | Losee et al. | 156/643 |
| 4,994,405 | 2/1991 | Jayakar | 437/53 |
| 5,362,662 | 11/1994 | Ando et al. | 437/50 |
| 5,516,716 | 5/1996 | Hawkins et al. | 437/53 |
| 5,541,133 | 7/1996 | Peek | 437/53 |

*Primary Examiner*—Brian Dutton
*Attorney, Agent, or Firm*—James D. Leimbach

[57] ABSTRACT

A methodology for producing an edge aligned implant beneath an electrode with reduced lateral spread, comprising the steps of: providing a dielectric layer on a substrate; forming an etch-stop layer on the dielectric layer; forming a sacrificial material layer on the etch-stop layer; patterning the sacrificial layer with openings to expose the etch-stop layer and which openings corresponding to gate electrode positions; implanting dopant atoms through the opening into the substrate in regions adjacent to at least one edge of the opening in the sacrificial layer; depositing electrode material into the openings and onto the sacrificial layer; forming an electrode layer, either by itself of with another layer deposited or grown over it to allow alteration to provide an etch rate differential. The material that etches relatively slowly becomes or protects the gate electrode region. The alteration is done by a process such as diffusion or irradiation.

11 Claims, 6 Drawing Sheets

METHOD OF PERFORMING EDGE-ALIGNED IMPLANTS

FIELD OF THE INVENTION

This invention relates to the semiconductor devices, and more specifically, to creating edge aligned implants beneath electrodes.

BACKGROUND OF THE INVENTION

Solid-state imaging devices feature semiconductor, picture elements, referred to as pixels, which collect minority carriers in response to photons absorbed by the pixels. The charges so generated are integrated by collecting them in a potential well. Charge transfer is achieved by transporting the collected charges by line and column shift registers into an output circuit, as is well known. Charge-coupled devices (hereinafter, "CCD's"), in turn, are a preferred form of solid-state imaging devices, and it is the making of these to which this invention is particularly directed. More specifically, CCD's feature MOS capacitors and preferably buried channels created by ion implantation. It is the method of ion implantation and of formation of the corresponding electrodes that governs whether or not charge transfer in the CCD imaging device will be highly efficient or not.

More specifically, in the field of two-phase charge-coupled devices, it is essential that the devices be prepared in such a way as to obtain edge alignment between the potential well formed by an ion-implanted strip, and its overlying electrode. Failure to do so produces stray potential wells and barriers which hinder efficient delivery of charges, and the performance of the device is degraded.

In U.S. Pat. No. 4,035,906, a process for forming CCD's is described wherein the mask used to ion-implant the first set of implanted strips is removed and is not available for the formation of the first set of polysilicon strips. Instead, the polysilicon strips are located by benchmarks not identified, so as to be staggered with respect to the implanted strips, as in FIG. 2C and FIG. 2D of U.S. Pat. No. 4,035,906. This requires that the portion of the implanted substrate covered by the polysilicon strips, be freed of its implanted ions by diffusing them down into the underlying substrate (occurring between FIG. 2C and FIG. 2D). This is unsatisfactory as the downward diffusion is difficult to control. Furthermore, some dopant remains in the oxide, where it is not needed. A more serious drawback is that the dopant tends to excessively diffuse at the very edge of the underlying electrode, both downwardly and laterally. This causes unwanted alteration of the potential well of both the first set of electrodes as well as of the second set that is formed adjacent thereto. The undesired potential alteration tends to produce charge transfer inefficiency.

It is difficult in such a technique to satisfactorily control the out-diffusion. The difficulties are aggravated as the dimensions of the CCD decrease, a step necessitated by the overall reductions in integrated circuit dimensions. That is, a thinner isolation oxidation layer means a shorter oxidation time, and thus more sensitivity to stopping the out-diffusion exactly as needed.

U.S. Pat. No. 4,613,402 sets forth a method for accurately aligning strips of implanted dopant in a semiconductor substrate with conductive strips above the implant strips, comprising the steps of:

a) depositing a layer of conductive material above said semiconductor substrate;

b) forming a patterned mask above said silicon layer, the pattern exposing spaced-apart first strip portions of said conductive layer;

c) ion-implanting said dopant strips into said substrate through the conductive layer strip portions exposed by said patterned mask;

d) removing a portion of said mask but retaining the rest so as to expose said conductive layer over first portions of said substrate that contain an implanted dopant strip and over portions of said substrate adjacent to said first portions;

e) forming on said conductive layer between said retained mask portions, second strips of a material or of a thickness effective, when carrying out steps f) and g), to leave behind said second strips;

f) removing said retained mask portions; and g) etching away said conductive layer where the latter is not covered with said second strips.

Although this method is effective, it involves a number of process steps and is complicated.

As can be seen by the foregoing discussion, there remains a need within the art that is not overly complicated that can accurately align implant strips beneath an electrode in a semiconductor material.

SUMMARY OF THE INVENTION

It is an object of this invention to provide methods for accurately aligning the edge of the implanted regions in a semiconductor substrate with the edge of its overlying electrode, as is necessary to the making of CCDs.

This object is achieved through providing a semiconductor imager employing a method for producing an edge aligned implant beneath an electrode with reduced lateral spread, comprising the steps of:

a) providing a dielectric layer on a substrate;

b) forming an etch-stop layer on the dielectric layer;

c) forming a sacrificial material layer on the etch-stop layer;

d) patterning the sacrificial layer with openings to expose the etch-stop layer and which openings corresponding to gate electrode positions;

e) implanting dopant atoms through each opening into the substrate in regions adjacent to at least one edge of the opening in the sacrificial layer;

f) depositing electrode material into the openings and onto the sacrificial layer; and g) etching to form a gate electrode region by etching at a predetermined rate.

Advantageous Effect of the Invention

The present invention has the advantages that are gained by employing methods of self alignment that are inherently less sensitive to processing parameters in creating semiconductor imagers with implanted regions self aligned to electrode edges.

The present invention avoids the need to implant the dopants through relatively thick layers of polysilicon or other materials, thus avoiding undesirable lateral spread of the implant beyond the defined edge of the electrode. These methods are particularly applicable to the manufacture of two-phase CCD devices.

DESCRIPTION OF THE PREFERRED EMBODIMENTS

The present invention envisions three preferred embodiments for producing a dopant implant which is precisely registered with respect to an edge and placed under an electrode. The present invention avoids the necessity of implanting dopants through relatively thick layers of polycrystalline silicon (polysilicon) or other materials, thus avoiding undesirable lateral spread of the implant beyond the defined edge of the electrode. The present invention is particularly directed to the manufacture of two-phase CCD devices but may also be employed in other devices. Furthermore, they may be implemented with the equipment sets that are presently available and commonly used by semiconductor device manufacturers.

The first method employs the use of two photomasking steps and the isotropic etching of polysilicon to create edge aligned implants.

Figure 1A:
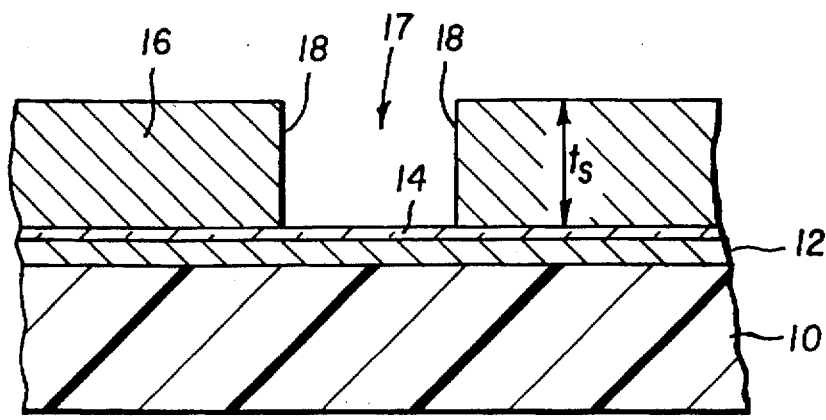
FIG. 1A is a cross sectional diagram illustrating the layers employed by the present invention.

Referring now to FIG. 1A, a substrate 10 is provided with a suitable dielectric 12 formed thereon. The dielectric 12 employed is either a standard gate oxide or an oxide/nitride layered stack. If a standard oxide gate dielectric is desired, the substrate 10 is coated with a suitable etch-stop layer 14 as shown in FIG. 1A, e.g., a silicon nitride layer. This layer need be no thicker than necessary to stop the etch of a sacrificial layer 16 of material which will be deposited onto the etch-stop layer 14. For example, a layer of $Si_3N_4$ having a thickness >200 angstroms can be used with a sacrificial layer 16 of deposited $SiO_2$ which is approximately 5000 angstroms thick. Amorphous carbon may similarly be used as an etch-stop layer. The thickness of sacrificial material 16 is denoted by dimension line ts in FIG. 1A. The sacrificial layer thickness should be in excess of the desired thickness of the electrode material to be added as will be described later.

Still referring to FIG. 1A, open areas 17 in the sacrificial layer 16 are formed where gate electrodes are to be formed. This is done using conventional photolithography and etch processes. It is desirable that the sidewalls 18 of the openings in the sacrificial layer 16 be as nearly vertical as possible. The etch-stop layer 14 may then be removed from the openings 17 or may be retained and incorporated as part of the dielectric stack. (for example, nitride may be retained if an oxide/nitride dielectric is desired).

Figure 1B:
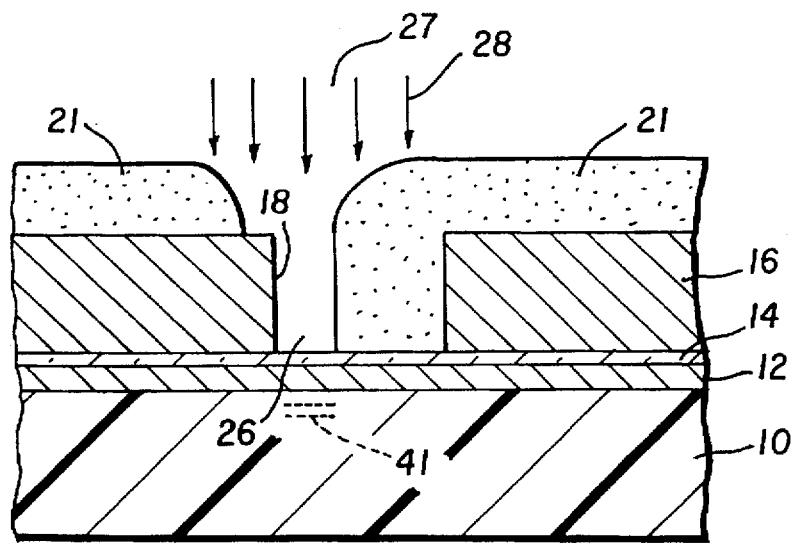
FIG. 1B is the cross sectional diagram of FIG. 1A with a patterned photoresist formed upon it.

Referring now to FIG. 1B, a patterned photoresist layer 21 is formed over the remaining portions of the sacrificial layer 16 such that the patterned photoresist 21 provides openings 26 which overlap at least one of the sidewall 18 edges formed from the opening 17 in the sacrificial layer 16. Dopant atoms 27 are then implanted with energy insufficient to penetrate the sacrificial layer or the photoresist coating but sufficient to penetrate the dielectric and/or etch-stop layers 12, 14, respectively, thus producing implanted region 41. The implantation of the dopant is indicated by arrows 28. The photoresist is then removed by any conventional procedure such as ashing in an oxygen plasma.

Figure 1C:
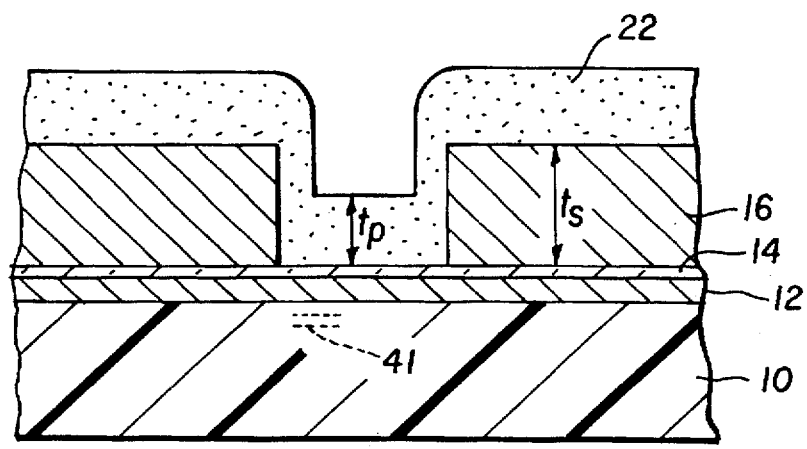
FIG. 1C is the cross sectional diagram of FIG. 1B with an electrode material added.

Referring now to FIG. 1C, the wafer is coated with an electrode material 22, such as polysilicon. The thickness of the electrode material 22, denoted by dimension line tp in FIG. 1C, which is chosen according to criteria to be explained below.

Figure 1D:
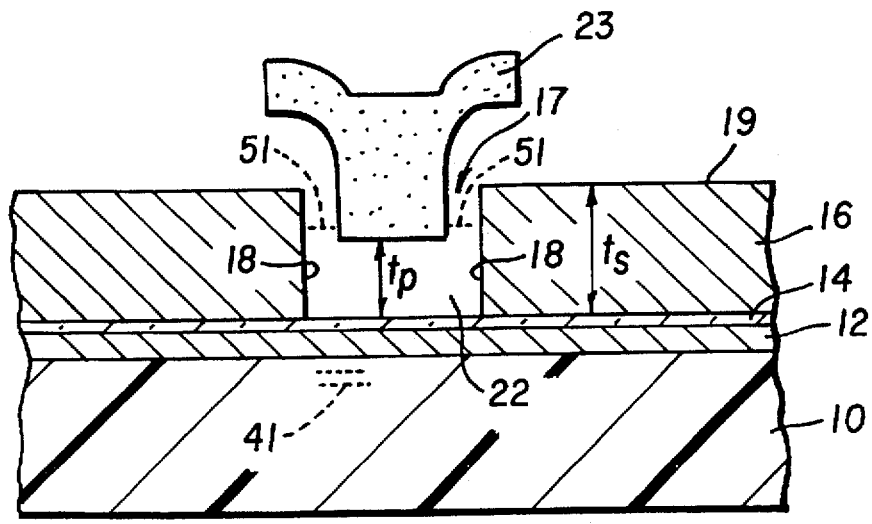
FIG. 1D is the cross sectional diagram of FIG. 1C with the patterned photoresist formed upon it.

Referring next to FIG. 1D, photoresist 23 is deposited and patterned on electrode material 22 and is situated above the opening 17 in sacrificial layer 16. Next, electrode material 22 is etched with an etchant having an isotropic, or non-directional character, to remove the electrode in areas not protected by the photoresist, and exposing etch boundary regions 51. Such etch boundary regions are desired to be situated below the upper surface 19 of the sacrificial layer 16 and bounded by the sidewalls 18 of the sacrificial layer. The photoresist 21 is then removed and the sacrificial layer is removed by any convenient process, leaving the final configuration, as illustrated in FIG. 1E, wherein the implanted dopant region 41 is in precise alignment with an edge 52 of the electrode material.

Figure 1E:
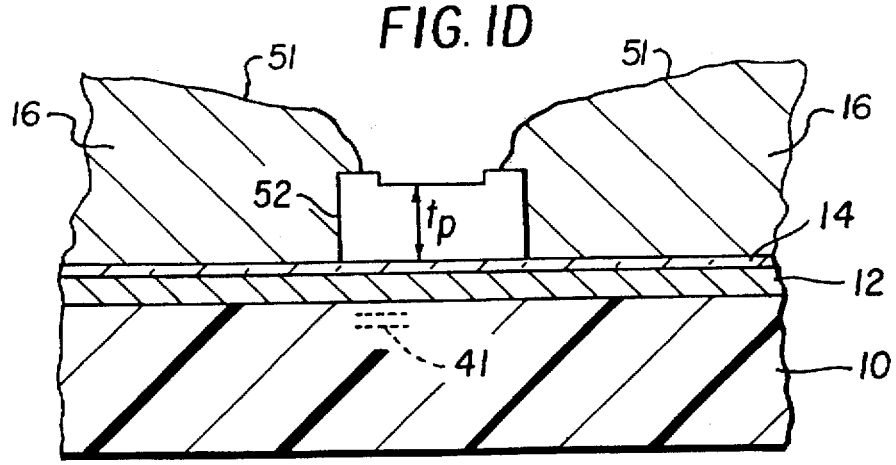
FIG. 1E is the cross sectional diagram of FIG. 1D illustrating the completed electrode.
Figure 1F:
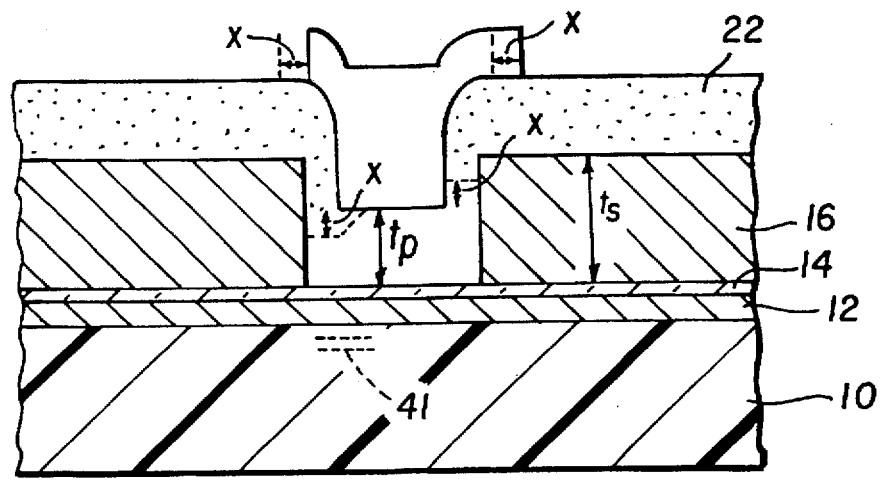
FIG. 1F is a cross-sectional diagram of the structure of FIG. 1C with patterned photoresist, where the photoresist pattern is misaligned by a lateral offset distance x as compared with the photoresist pattern shown in FIG. 1D.
Figure 1G:
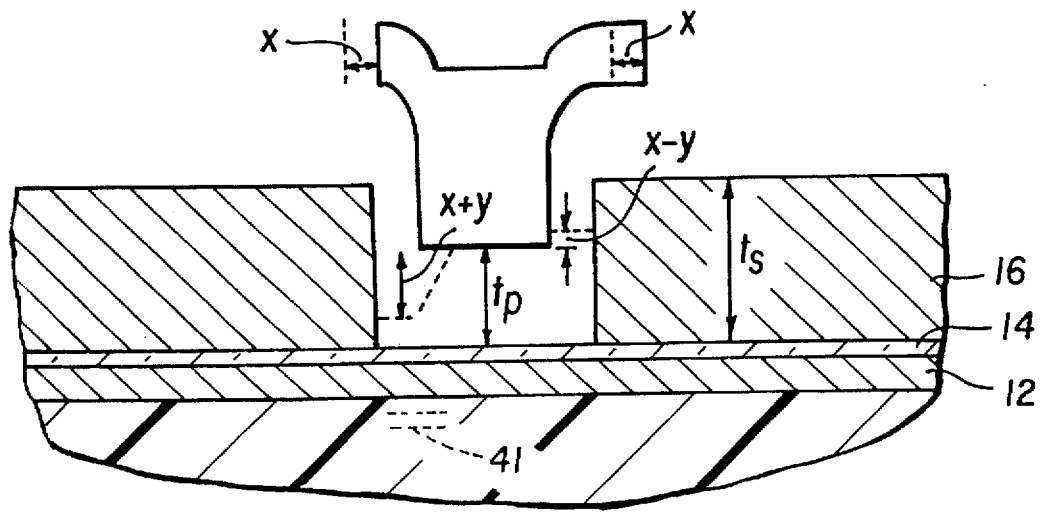
FIG. 1G is a cross-sectional diagram of the structure of FIG. 1F where the electrode material has been etched by an amount y more than the etch distance indicated in FIG. 1D.
Figure 1H:
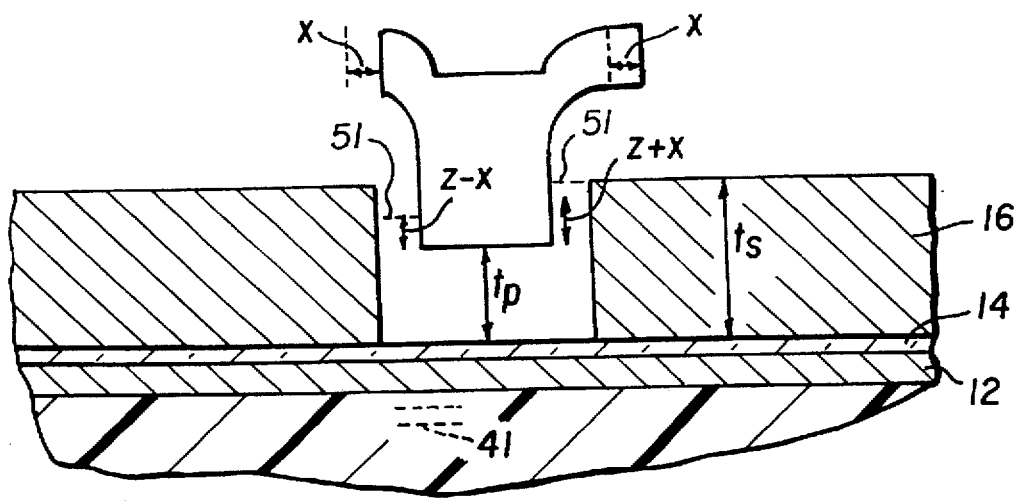
FIG. 1H is a cross-sectional diagram of the structure of FIG. 1F where the electrode material has been etched by an amount z less than the etch distance indicated in FIG. 1D.

The case illustrated in FIG. 1D and FIG. 1E is somewhat idealized in that the perfect alignment of photoresist mask 23 has been assumed and that the lateral or isotropic etch of the electrode material is also precisely controlled. In FIGS. 1F through 1H, consideration is given to practical tolerances for photoresist positioning and for etch control and how these tolerances may be related to selection of thicknesses, tp and ts, chosen for the electrode layer and the sacrificial layer, respectively.

Referring now to FIG. 1F, the resist 23 is misaligned by an amount generally indicated as x, but the etch removes the same amount of the electrode, laterally, under the resist as in FIG. 1D. For this condition, the above criteria imply that electrode thickness tp satisfy Equation (1) below:

$$tp > x. \qquad \text{Equation (1)}$$

For the case of overetch of the polysilicon by amount y (on each edge) with misalignment of the resist by amount x, refer to FIG. 1G. Here the criterion is expressed by equation (2):

$$tp > x+y \qquad \text{Equation (2)}$$

For the case of resist misalignment x, and underetch (on each edge) by amount z refer to FIG. 1H. In this case the criteria becomes the expression shown in Equation (3):

$$ts-tp > x+z \qquad \text{Equation (3)}$$

rearranging, this becomes: ts>x+z+tp

Conditions given by Equations (1) and (2) are useful for selecting the appropriate thickness of the sacrificial and polysilicon layers. Typical nominal values are 4000 angstroms and 6000 angstroms for tp and ts, respectively, where dimensions x an y are each less than 1000 angstroms.

Referring now to FIG. 1D through FIG. 1H, in each case the electrode material is etched with a process that provides a degree of isotropic etching. The etch is continued to the point that lateral etching on the electrode edges is sufficient to completely remove electrode material from the top of the sacrificial oxide layer but is insufficient to completely remove the material from regions where the resist pattern lies over an edge of the sacrificial layer and where the electrode material contacts the gate dielectric layer. The photoresist is then removed and the device is completed according to conventional processing methods.

Figure 2A:
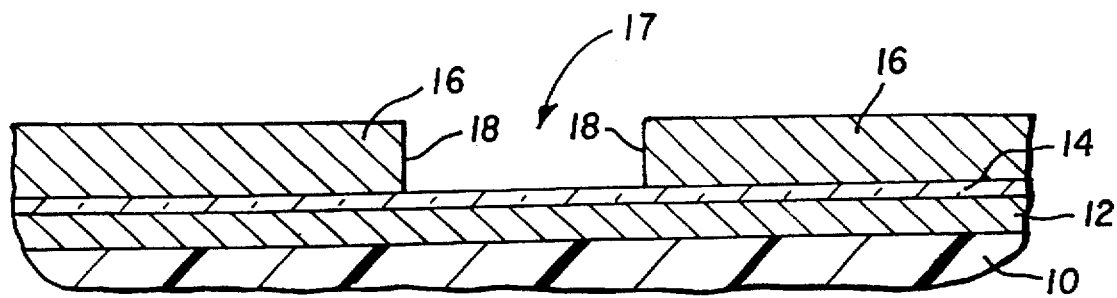
FIG. 2A is a diagram illustrating the initial layers used in the second embodiment of the invention.

The second embodiment of the present invention employs lateral oxidation techniques upon the polysilicon. Referring to FIG. 2A, substrate 10 is provided with suitable gate dielectric 12. The gate dielectric 12 used could be either a standard gate oxide or an oxide/nitride gate layer stack. If a standard oxide gate dielectric is desired, then the substrate 10 is coated with a suitable etch-stop layer 14, e.g., silicon nitride layer. This layer need be no thicker than necessary to stop the etch of a sacrificial layer of material which will be deposited onto the etch-stop layer. For example, $Si_3N_4$ of thicknesses >200 angstroms can be used with a sacrificial layer 16 of deposited $SiO_2$ which is approximately 5000 angstroms thick. Amorphous carbon may similarly be used as an etch-stop layer 14. Preferably, the material for the sacrificial layer 16 is deposited upon the etch-stop layer at a thickness on the order of 5000 angstroms oxide. The sacrificial layer 16 thickness should be made such that it exceeds the desired thickness of the gate electrode that will be formed, thereafter.

Still referring to FIG. 2A, and similar to the first embodiment, open areas 17 in the sacrificial layer 16 are created where gate electrodes are to be fashioned. This is done with conventional photolithography and etch processes. It is desirable that the sidewalls 18 of the openings in the sacrificial layer 16 be as nearly vertical as possible. The photoresist is then removed by any convenient method such as ashing in an oxygen plasma. The etch-stop layer 14 can then be removed from the openings or may be retained and incorporated as part of the gate dielectric stack (for example, nitride may be retained if an oxide/nitride gate dielectric is desired).

Figure 2B:
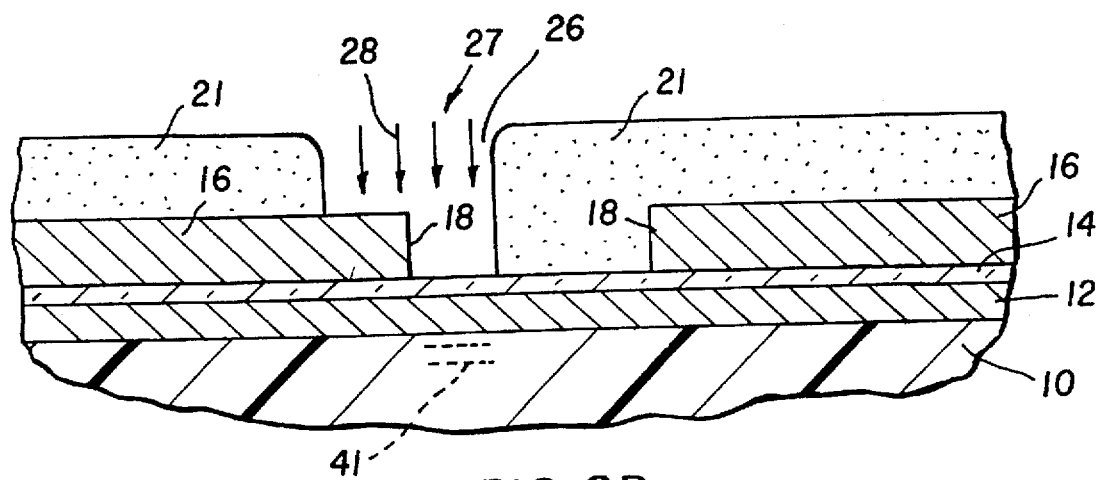
FIG. 2B illustrates the formation of an implant through openings within a photoresist formed upon the structure in the diagram of FIG. 2A.

Referring to FIG. 2B, again, as discussed in the first preferred embodiment previously discussed, a photoresist 21 is patterned to provide openings 26 which overlap at least one edge of the opening in the sacrificial (oxide) layer 16. Dopant atoms 27 are then implanted with energy insufficient to penetrate the sacrificial layer or the photoresist coating but sufficient to penetrate the dielectric and/or etch-stop layers 12, 14, respectively, thus producing implanted region 41. The implantation of the dopant is indicated by arrows 28.

The photoresist is then removed by any conventional procedure such as ashing in an oxygen plasma.

Figure 2C:
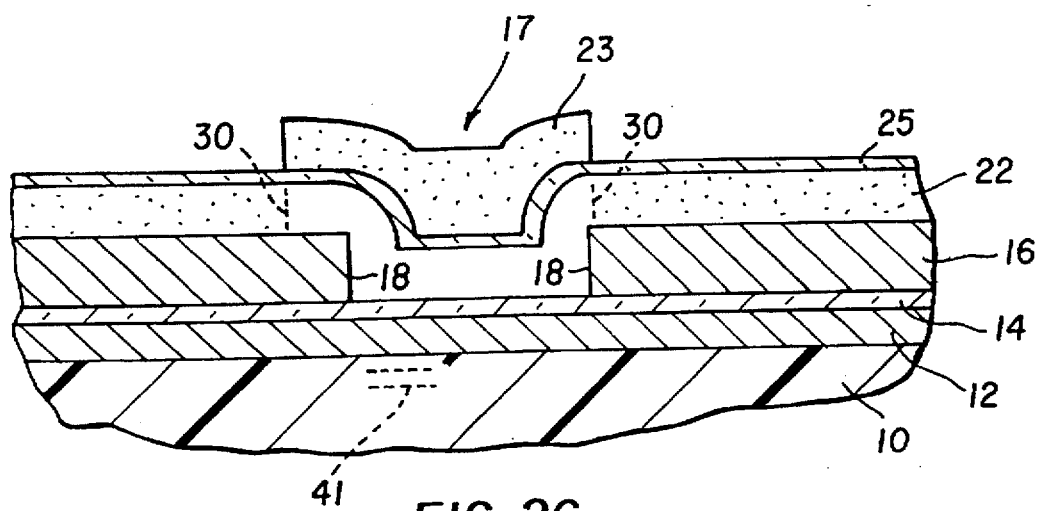
FIG. 2C shows the formation of a polysilicon electrode and an overlayer of an oxidation resistant material.

Referring to FIG. 2C, the wafer is coated with a polysilicon layer 22 followed by a coating to create an oxidation resistant layer 25, a material such as silicon nitride may be used to create the oxidation resistant layer 25. A photoresist layer 23 is patterned over the regions where it is desired that gate electrodes be formed. The photoresist layer 23 should be positioned to overlay at least one of the vertical edges 18 within the opening 17 in sacrificial layer 16. The wafer is then etched, preferably using a plasma etch process, for example, a plasma generated in a gas mixture containing fluorine containing gas, wherein exposed portions of the oxidation resistant layer 25, silicon nitride for example, are removed and the underlying polysilicon is exposed. The exposed polysilicon is then etched, also preferably with a fluorine containing plasma, by a process which is substantially anisotropic, to define nitride/polysilicon edges 30, comprising the etched edge of the electrode material, here the polysilicon 22, with the oxidation resistant layer 25 remaining on top.

Figure 2D:
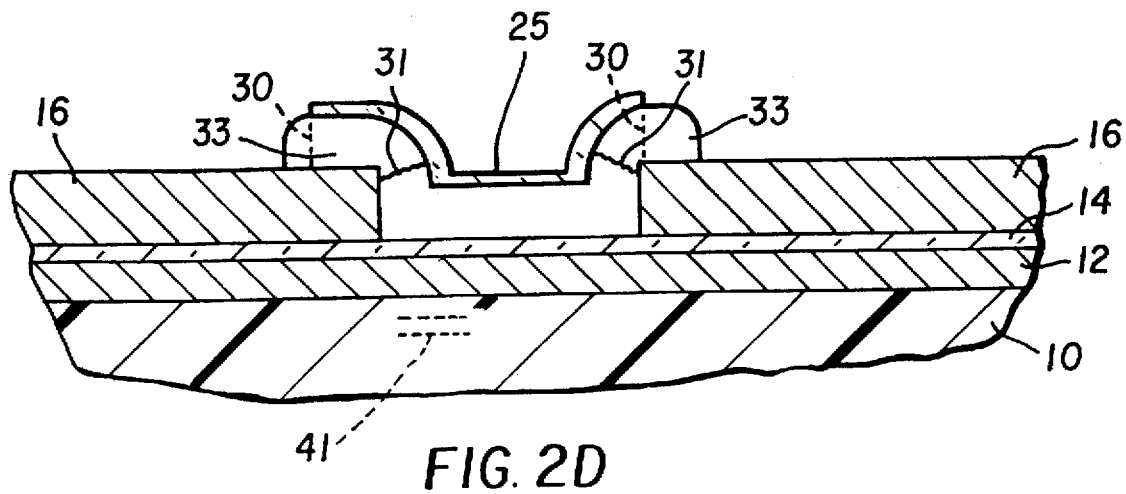
FIG. 2D shows the edges of the polysilicon which do not overlay the sacrificial material.

Referring now to FIG. 2D, the photoresist layer 23 is removed by any conventional method and the wafer is subjected to an oxidizing ambient. The oxidation time is selected such that the polysilicon edges 30 are oxidized, thus consuming polysilicon material in the edge regions to produce a new polysilicon edge 31, which is the boundary between the laterally oxidized electrode material 33 and the polysilicon as seen in FIG. 2D. Here it is apparent that at least one edge 31 is situated below the upper level of the sacrificial oxide layer 16. The sacrificial oxide and the oxidized edges of the polysilicon are then removed by conventional means such as in a buffered HF solution.

Figure 2E:
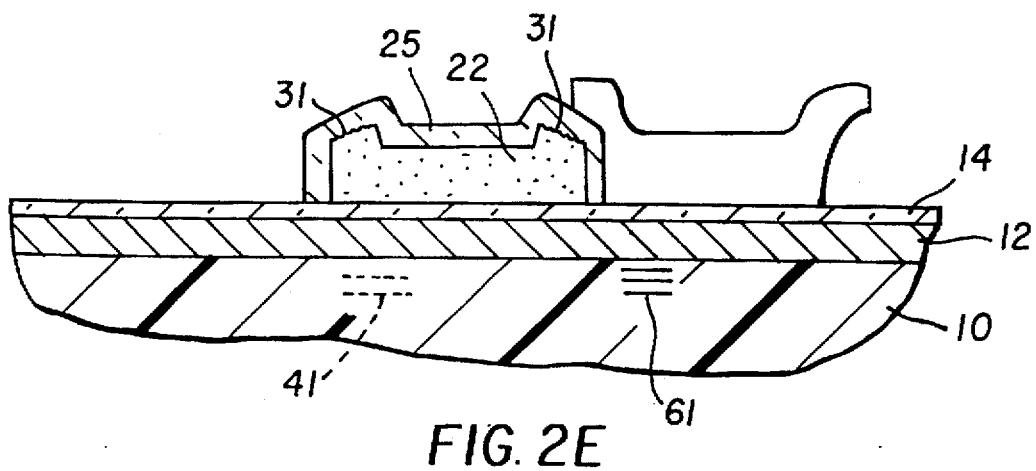
FIG. 2E shows the completed electrode.

The etch-stop layer 14 may also have the exposed portion removed if so desired employing conventional processing methods. The complete electrode 22 is as illustrated in FIG. 2E. As shown in FIG. 2E, it is envisioned that adjacent electrodes have an implant 61 that is self aligned with that electrode. This would be a charge coupled device configuration. The device is completed according to conventional processing methods.

Figure 3A:
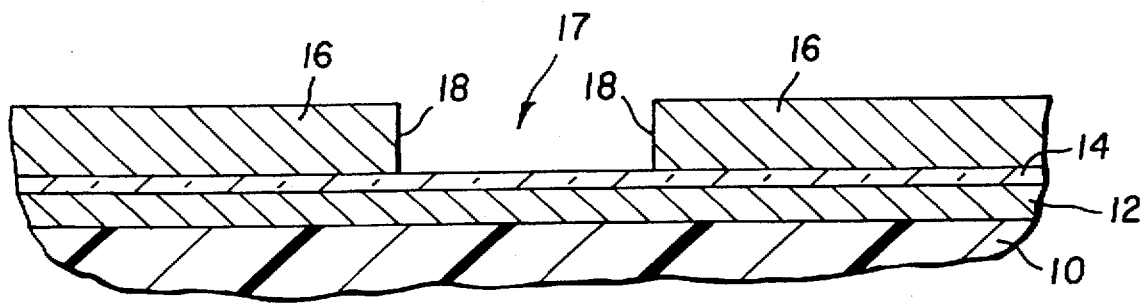
FIG. 3A is a diagram illustrating the initial layers used in the third embodiment of the invention.
Figure 3B:
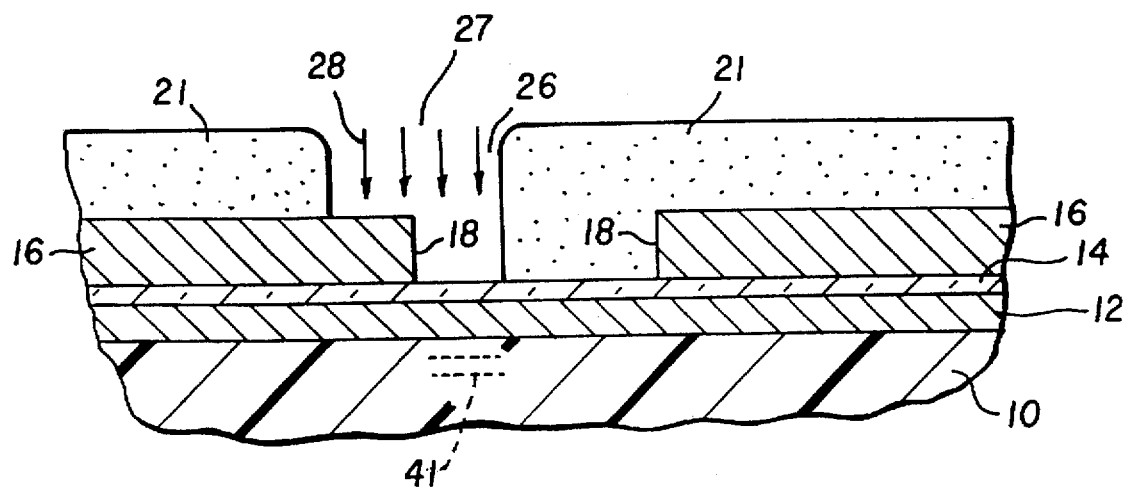
FIG. 3B illustrates the formation of an implant through openings within a photoresist formed upon the diagram of FIG. 3A.

The third method of performing the present invention can be seen in FIGS. 3A through 3D. In a manner similar to the first two embodiments previously discussed, FIGS. 3A and 3B illustrate the first steps required in the third method which are the same as the first steps required in the previously discussed embodiments. A substrate 10 is provided having a suitable gate dielectric 12, which could be either a standard gate oxide or an oxide/nitride gate layer stack. If a standard oxide gate dielectric is desired as shown, then the substrate 10 must be coated with a suitable etch-stop layer 14, which in the preferred embodiment is a silicon nitride layer. This layer need be no thicker than necessary to stop the etch of a sacrificial layer of material which will be deposited onto the etch-stop layer. For example, $Si_3N_4$ of thickness >200 angstroms can be used with a sacrificial layer of deposited $SiO_2$ which is approximately 5000 angstroms thick. Amorphous carbon may similarly be used as an etch stop layer. Deposit the sacrificial material layer, say 5000 angstroms oxide, onto the etch-stop layer. The sacrificial layer thickness should be in excess of the desired thickness of the gate electrode. Its thickness is determined according to the considerations outlined above in connection with the first described method.

Again as previously discussed in the earlier embodiments, open areas 17 are created in the sacrificial layer 16 where gate electrodes are intended to be formed. This is done using conventional photolithography and etch processes. In a manner as previously discussed, it is desirable that the sidewalls 18 of the openings 17 in the sacrificial layer 16 be as nearly vertical as possible. The etch-stop layer 14 is then removed from the openings 17 or, alternatively, the etch-stop layer 14 may be retained and incorporated as part of the gate dielectric stack. (for example, nitride may be retained if an oxide/nitride gate dielectric is desired).

Still referring to FIG. 3B in conjunction with FIG. 3A, a photoresist layer 21 is patterned to provide openings 26 which overlap at least one of the vertical edges 18 within opening 17 of sacrificial (oxide) layer 16. A dopant, such as boron, is implanted with energy insufficient to penetrate the sacrificial layer 16, or the photoresist coating, but sufficient to penetrate the gate dielectric 12. The implantation of the dopant is indicated by arrows 28. The photoresist is then removed by any convenient method such as ashing in a oxygen plasma.

Figure 3C:
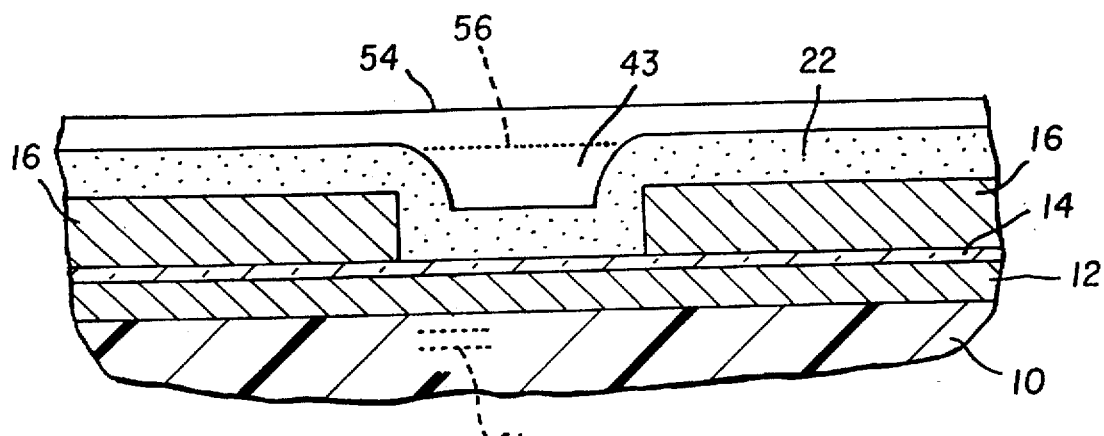
FIG. 3C shows the formation of layers used to form an electrode.

Referring now to FIG. 3C, the wafer is then coated with an electrode layer 22 in a manner as discussed in the previous embodiments. The wafer is spin coated with a low viscosity photoresist 54. The resist coating will be thicker in the depressed areas 43 of polysilicon where the openings have been cut in the sacrificial layer 16. Next, the wafers are subjected to an oxygen plasma of duration sufficient to remove resist from the areas with thin resist but insufficient to remove resist from areas 43 where the resist is thick, resulting in a new top surface 56 after the oxygen plasma that substantially resides within depressed area 43 of layer 22.

Figure 3D:
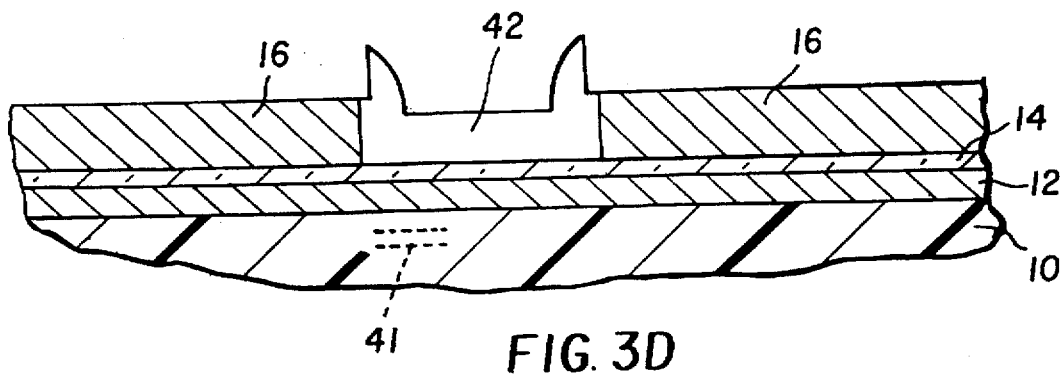
FIG. 3D the etched result of a completed electrode.

To produce the final electrode 42 as shown in FIG. 3D, the exposed polysilicon is etched with an anisotropic etch. The time of the etch should be sufficient to remove polysilicon from areas where the polysilicon covers the sacrificial layer but insufficient to remove the polysilicon from areas not covered by photoresist but adjacent to edges of the sacrificial material. The remaining photoresist in areas 43 is now removed by further exposure to oxygen plasma.

The remaining exposed silicon dioxide sacrificial layer 16 is then removed from the wafer by standard buffered HF etching solution. Remove any exposed etch-stop layer if desired. The device is completed according to conventional processing methods.

It should be readily apparent that the foregoing steps can be repeated to create adjacent electrodes having implanted dopant atoms to at least one edge.

The invention has been described in detail. In each of the three embodiments of the invention described, an implanted region 41 has been reproduced which is in precise alignment with an electrode edge and is situated beneath that electrode. In each case the sacrificial layer has been employed and subsequently removed from the final structure. While silicon dioxide has been described as suitable, other sacrificial materials are also feasible and are viewed to be within the scope of the invention. It will also be understood to those skilled in art that variations and modifications can be effected within the spirit and scope of the invention.

The invention has been described with reference to a preferred embodiment. However, it will be appreciated that variations and modifications can be effected by a person of ordinary skill in the art without departing from the scope of the invention.

Parts List 10 semiconductor substrate
12 dielectric layer
14 etch-stop layer
16 sacrificial layer
17 opening in sacrificial layer
18 sidewall of opening 17 in sacrificial material 16
19 upper surface of sacrificial layer 16

21 photoresist
22 electrode material (polysilicon)
23 photoresist material
25 oxidation resistant layer (silicon nitride)
26 opening in photoresist 21
27 dopant atoms
28 implantation of dopant 30 etched edge of electrode material layer 24
31 boundary between laterally oxidized material 24 and oxide 33.
33 oxidized portion of layer 24

41 implanted dopant region
42 completed electrode
43 depressed region in layer 22

51 etch boundary regions
52 electrode edge
54 low viscosity photoresist
56 nw top surface
61 implanted dopant tp electrode thickness
ts thickness of the sacrificial layer

We claim:

1. A method for producing an edge aligned implant beneath an electrode comprising the steps of:
   a) providing a dielectric layer on a substrate;
   b) forming an etch-stop layer on the dielectric layer;
   c) forming a sacrificial layer on the etch-stop layer;
   d) patterning the sacrificial layer with an opening to expose the etch-stop layer the opening corresponding to gate electrode positions;
   e) removing the etch stop layer in the opening;
   f) implanting dopant atoms through the opening into the substrate in regions adjacent to at least one edge of the opening;
   g) depositing electrode layer into the opening and onto the sacrificial layer; and
   h) etching the electrode layer to form a gate electrode region.

2. The method of claim 1 wherein the step of g) etching is replaced by the steps of:
   g) providing a photoresist mask over the opening and overlapping at least one edge of the sacrificial layer;
   h) etching the electrode material on the sacrificial layer and with sufficient lateral etching beneath a photoresist edge to completely remove electrode material from the top surface of the sacrificial layer; and
   i) removing the sacrificial layer.

3. The method of claim 1 wherein the method is employed to make a two-phase CCD device.

4. The method for producing an edge aligned implant of claim 1 wherein the step of depositing further comprises depositing an electrode layer which is adapted to be oxidized into the opening and onto the sacrificial layer and further comprises in place of step g) the steps of:
   g) forming an oxidation resistant layer onto the electrode material;

h) providing a photoresist mask over the opening and overlapping at least one edge of the sacrificial layer;

i) etching a portion of the oxidation resistant material on the electrode layer to expose a portion of the electrode layer;

j) etching the exposed portion of the electrode layer to expose the sacrificial layer and form at least one electrode edge;

k) oxidizing the electrode edge to an extent so that no unoxidized portion of the electrode layer remains above the sacrificial layer;

l) removing the oxidized portion of the electrode layer and the oxidation resistant layer; and m) removing the sacrificial layer.

5. The method of claim 4 wherein the electrode layer is formed with polysilicon.

6. The method of claim 5 wherein the electrode layer is anisotropically etched.

7. The method for producing an edge aligned implant beneath an electrode as defined by the steps of claim 1 wherein the step of etching the electrode layer is replaced by the steps of:

g) forming a planarizing layer with a substantially planar top surface on the electrode layer;

h) removing portions of the planarizing layer such that the planarizing layer is removed over areas where the sacrificial layer has been retained to expose the electrode layer and such that portions of the planarizing layer remain over areas where the sacrificial material has been removed;

i) removing the exposed gate electrode layer from over the sacrificial layer but retaining portions of the electrode layer in the opening; and j) removing the planarizing layer and the sacrificial layer.

8. The method of claim 7 wherein the electrode layer is anisotropically etched.

9. A charge coupled device product for image sensing devices having edge aligned implants defined by the steps of:

a) providing a dielectric layer on a substrate;

b) forming an etch-stop layer on the dielectric layer;

c) forming a sacrificial material layer on the etch-stop layer;

d) patterning the sacrificial layer to form an opening exposing the etch-stop layer the opening corresponding to an gate electrode position;

e) removing the etch stop layer in the opening;

f) implanting dopant atoms through the opening into the substrate in regions adjacent to at least one edge of the opening in the sacrificial layer;

g) depositing electrode material into the opening and onto the sacrificial layer;

h) etching to form a gate electrode region; and

I) removing the sacrificial layer.

10. The method of claim 9 wherein the steps a) through h) are repeated to create adjacent electrodes having implanted dopant atoms adjacent to at least one edge.

11. The method of claim 9 wherein the step of depositing electrode material further comprises:

forming an electrode layer with another layer to provide etch rate differential.

\* \* \* \* \*